United States Patent
Uzoh et al.

(10) Patent No.: US 9,799,626 B2
(45) Date of Patent: Oct. 24, 2017

(54) SEMICONDUCTOR PACKAGES AND OTHER CIRCUIT MODULES WITH POROUS AND NON-POROUS STABILIZING LAYERS

(71) Applicant: Invensas Corporation, San Jose, CA (US)

(72) Inventors: Cyprian Uzoh, San Jose, CA (US); Rajesh Katkar, San Jose, CA (US)

(73) Assignee: INVENSAS CORPORATION, San Jose, CA (US)

( * ) Notice: Subject to any disclaimer, the term of this patent is extended or adjusted under 35 U.S.C. 154(b) by 0 days.

(21) Appl. No.: 14/852,855

(22) Filed: Sep. 14, 2015

(65) Prior Publication Data
US 2016/0079138 A1   Mar. 17, 2016

Related U.S. Application Data

(60) Provisional application No. 62/050,728, filed on Sep. 15, 2014.

(51) Int. Cl.
*H01L 21/00* (2006.01)
*H01L 23/12* (2006.01)
(Continued)

(52) U.S. Cl.
CPC ........ *H01L 24/97* (2013.01); *H01L 21/32133* (2013.01); *H01L 21/486* (2013.01);
(Continued)

(58) Field of Classification Search
CPC . H01L 23/3142; H01L 23/481; H01L 21/561; H01L 21/486; H01L 23/36;
(Continued)

(56) References Cited

U.S. PATENT DOCUMENTS 5,379,186 A * 1/1995 Gold ................... H01L 23/3121
                                                        174/521
6,455,785 B1   9/2002 Sakurai et al.
(Continued)

FOREIGN PATENT DOCUMENTS

| | | |
|---|---|---|
| EP | 0 512 401 A2 | 11/1992 |
| EP | 0 962 974 A2 | 12/1999 |
| WO | WO 2015/102838 | 7/2015 |

OTHER PUBLICATIONS

U.S. Appl. No. 14/704,714, filed May 5, 2014.
(Continued)

*Primary Examiner* — Alonzo Chambliss
(74) *Attorney, Agent, or Firm* — Haynes and Boone, LLP

(57) ABSTRACT

Integrated circuits (ICs 110) are attached to a wafer (120W). A stabilization layer (404) is formed over the wafer to strengthen the structure for further processing. Unlike a conventional mold compound, the stabilization layer is separated from at least some wafer areas around the ICs by one or more gap regions (450) to reduce the thermomechanical stress on the wafer and hence the wafer warpage. Alternatively or in addition, the stabilization layer can be a porous material having a low horizontal elastic modulus to reduce the wafer warpage, but having a high flexural modulus to reduce warpage and otherwise strengthen the structure for further processing. Other features and advantages are also provided.

19 Claims, 10 Drawing Sheets

(51) Int. Cl.

| | |
|---|---|
| *H01L 23/00* | (2006.01) |
| *H01L 21/3213* | (2006.01) |
| *H01L 23/498* | (2006.01) |
| *H01L 21/822* | (2006.01) |
| *H01L 23/31* | (2006.01) |
| *H01L 25/07* | (2006.01) |
| *H01L 25/11* | (2006.01) |
| *H01L 25/00* | (2006.01) |
| *H01L 23/538* | (2006.01) |
| *H01L 21/56* | (2006.01) |
| *H01L 21/48* | (2006.01) |
| *H01L 23/14* | (2006.01) |
| *H01L 23/15* | (2006.01) |

(52) U.S. Cl.
CPC .......... *H01L 21/561* (2013.01); *H01L 21/822* (2013.01); *H01L 23/3128* (2013.01); *H01L 23/3135* (2013.01); *H01L 23/3142* (2013.01); *H01L 23/49827* (2013.01); *H01L 23/5384* (2013.01); *H01L 24/73* (2013.01); *H01L 25/072* (2013.01); *H01L 25/115* (2013.01); *H01L 25/50* (2013.01); *H01L 23/147* (2013.01); *H01L 23/15* (2013.01); *H01L 23/49816* (2013.01); *H01L 24/13* (2013.01); *H01L 24/16* (2013.01); *H01L 24/29* (2013.01); *H01L 24/32* (2013.01); *H01L 24/81* (2013.01); *H01L 24/83* (2013.01); *H01L 2224/131* (2013.01); *H01L 2224/16225* (2013.01); *H01L 2224/16227* (2013.01); *H01L 2224/2919* (2013.01); *H01L 2224/2929* (2013.01); *H01L 2224/29299* (2013.01); *H01L 2224/32013* (2013.01); *H01L 2224/73204* (2013.01); *H01L 2224/73253* (2013.01); *H01L 2224/81007* (2013.01); *H01L 2224/83007* (2013.01); *H01L 2224/83192* (2013.01); *H01L 2224/97* (2013.01); *H01L 2924/07025* (2013.01); *H01L 2924/15192* (2013.01); *H01L 2924/3511* (2013.01)

(58) Field of Classification Search
CPC ......... H01L 23/28; H01L 21/56; H01L 24/97; H01L 23/561; H01L 21/32133; H01L 21/822; H01L 23/3128; H01L 23/3135; H01L 24/73; H01L 23/49827; H01L 23/5384

See application file for complete search history.

(56) References Cited

U.S. PATENT DOCUMENTS

| | | | |
|---|---|---|---|
| 7,816,183 B2 | 10/2010 | Kawata | |
| 8,129,849 B1* | 3/2012 | Kim | H01L 21/561 |
| | | | 257/687 |
| 8,138,015 B2 | 3/2012 | Joseph et al. | |
| 8,426,961 B2* | 4/2013 | Shih | H01L 21/486 |
| | | | 257/698 |
| 8,618,659 B2 | 12/2013 | Sato et al. | |
| 8,822,269 B2* | 9/2014 | Hayashi | H01L 21/4853 |
| | | | 174/256 |
| 8,841,759 B2 | 9/2014 | Son | |
| 8,969,132 B2 | 3/2015 | Sherrer et al. | |
| 9,012,269 B2 | 4/2015 | Jin et al. | |
| 9,252,127 B1* | 2/2016 | Shen | H01L 25/50 |
| 2005/0224829 A1* | 10/2005 | Negley | H01L 33/52 |
| | | | 257/99 |
| 2007/0045798 A1* | 3/2007 | Horie | H01L 23/3675 |
| | | | 257/678 |
| 2007/0139892 A1* | 6/2007 | Iijima | H01L 23/3675 |
| | | | 361/704 |
| 2009/0261484 A1* | 10/2009 | Kanagawa | C08K 3/0033 |
| | | | 257/793 |
| 2011/0272785 A1* | 11/2011 | Toong | H01L 23/367 |
| | | | 257/532 |
| 2013/0082399 A1 | 4/2013 | Kim et al. | |
| 2013/0285259 A1 | 10/2013 | Han | |
| 2014/0036454 A1 | 2/2014 | Caskey et al. | |
| 2014/0077352 A1* | 3/2014 | Leal | H01L 24/32 |
| | | | 257/704 |
| 2014/0110049 A1 | 4/2014 | Yuen et al. | |
| 2014/0124955 A1 | 5/2014 | Chen et al. | |
| 2014/0272358 A1 | 9/2014 | Meador et al. | |
| 2015/0076987 A1 | 3/2015 | Sauti et al. | |
| 2015/0141544 A1 | 5/2015 | Meador et al. | |
| 2015/0364392 A1* | 12/2015 | Takahashi | H01L 24/74 |
| | | | 257/704 |

OTHER PUBLICATIONS

U.S. Appl. No. 14/275,514, filed May 12, 2014.
U.S. Appl. No. 14/275,519, filed May 12, 2014.
F. Greiner, M. Guttmann, P. Meyer, H. F. Schlaak; Fabrication of 3D-MEMS with High Aspect Ratio Micro Wires; 10th international Workshop on High Aspect Ratio Micro and Nano System Technology, Berlin Apr. 21-24, 2013, Book of Abstracts, pp. 19-20.
Donald W. Johnson et al., "Multi-level HAR Microstructures Patterned in SUEX Dry Film Resist", 10th international Workshop on High Aspect Ratio Micro and Nano System Technology, Berlin Apr. 21-24, 2013, Book of Abstracts, pp. 85-86.
M. Börner et al., "The Potential of Modern X-ray Resists for High Aspect Ratio Microstructure Fabrication—A Comparison", 10th international Workshop on High Aspect Ratio Micro and Nano System Technology, Berlin Apr. 21-24, 2013, Book of Abstracts, pp. 178-179.
Dawit Yemane et al., "X-ray Patterning of SUEX Dry Film Resist on Printed Circuit Board Substrates", 10th international Workshop on High Aspect Ratio Micro and Nano System Technology, Berlin Apr. 21-24, 2013, Book of Abstracts, pp. 219-220.
Donald W. Johnson et al., SUEX Dry Film Resist—A new Material for High Aspect Ratio Lithography, DJ DevCorp, Massachusetts, available at https://www.google.com/url?sa=t&rct=j&q=&esrc=s&source=web&cd=2&cad=rja&uact=8&ved=0CCgQFjABahUKEwjY28LQy7DHAhVXnYgKHbguAvY&url=http%3A%2F%2Fwww.camd.lsu.edu%2Fmicrofabrication%2Fhighlights%2FDJ_AR2012_SUEX%2520overview.pdf&ei=-hLSVdj2Bde6ogS43YiwDw&usg=AFQjCNFZv0IGUL8J_qEXA3d6JMnDzTD_Jg&bvm=bv.99804247,d.cGU, pulled Aug. 14, 2015.
Nanoimprint lithography, Wikipedia, pulled Aug. 14, 2015, 8 pages.
"Polyimide Aerogels for acoustic and thermal insulation and lightweight structures for automotive vehicles and other applications", NASA PS-00582-02H2-1011, 2 pages, pulled Jul. 28, 2015.
"SU-8 photoresist", Wikipedia, pulled Aug. 14, 2015, 4 pages.
SUEX TDFS, general poster, DEVCORP, 2011 (1 page).
Suresh Ramalingam (Xilinx), Advancing high performance heterogeneous integration through die stacking, European 3D TSV Summit, Jan. 22-23, 2013.
*Invensas™High Performance BVA PoP package for Mobile Systems*, May 2013, Invensas Corporation of San Jose, CA.
E. Zakel et al., "High Speed Laser Solder Jetting Technology for Optoelectronics and MEMS Packaging", ICEP 2002.
NASA (National Aeronautics and Space Administration), United States of America, in a data sheet "NASA's Glenn Research Center's Mechanically Strong, Flexible Polyimide Aerogels", Oct. 16, 2012 (2 pages).
Invitation to Pay Additional Fees received in PCT application PCT/US2015/050026, dated Jan. 4, 2016.

* cited by examiner

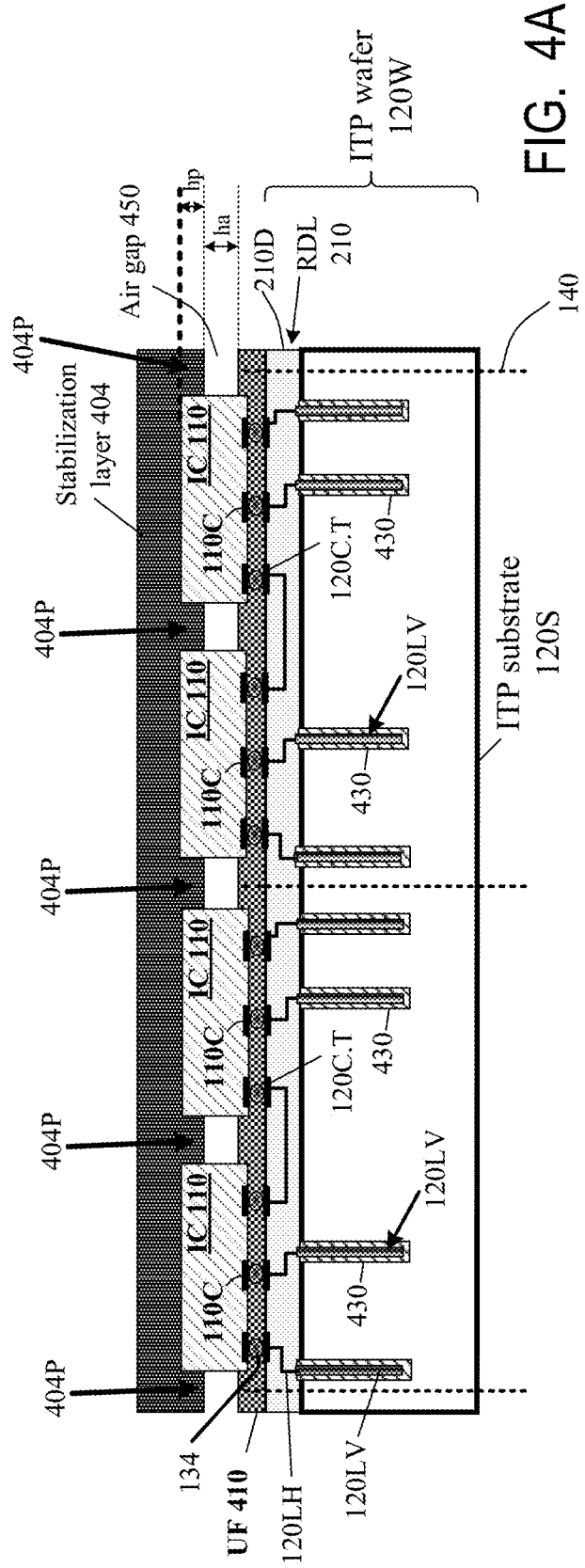

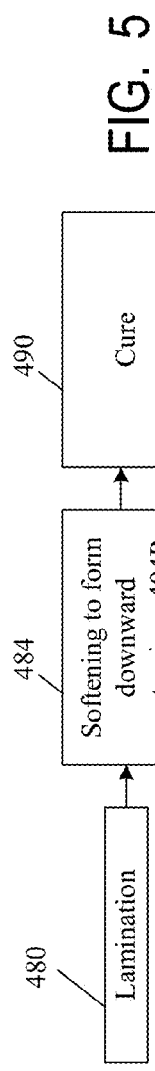
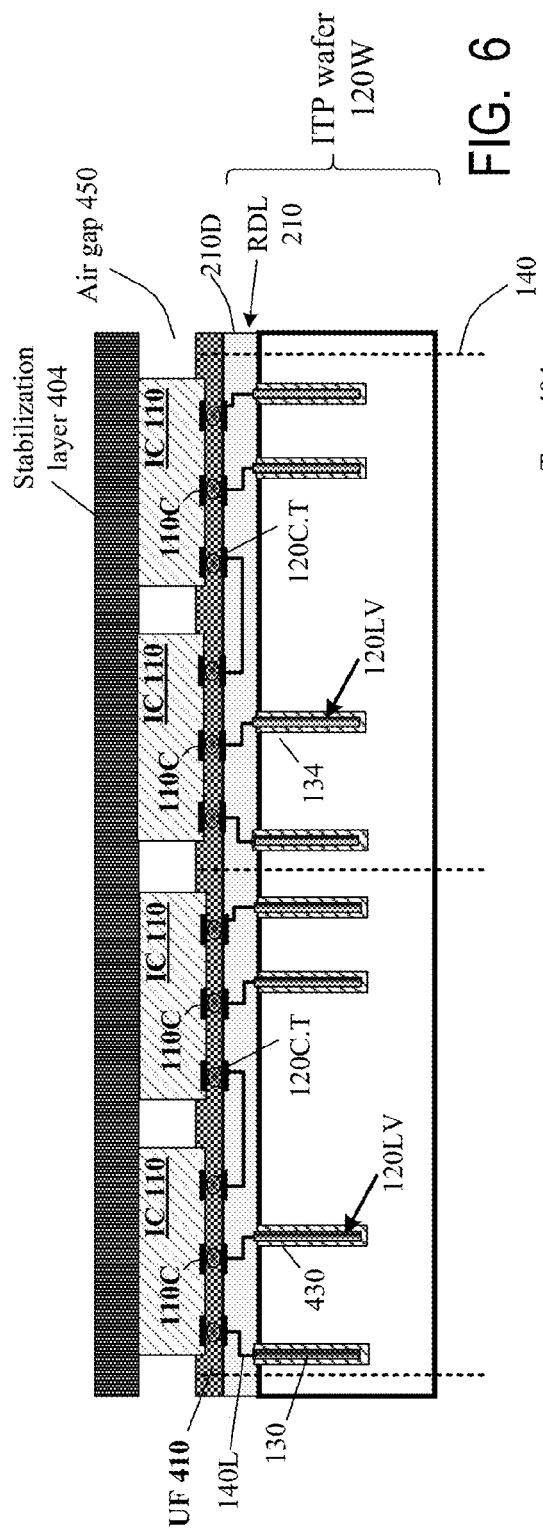
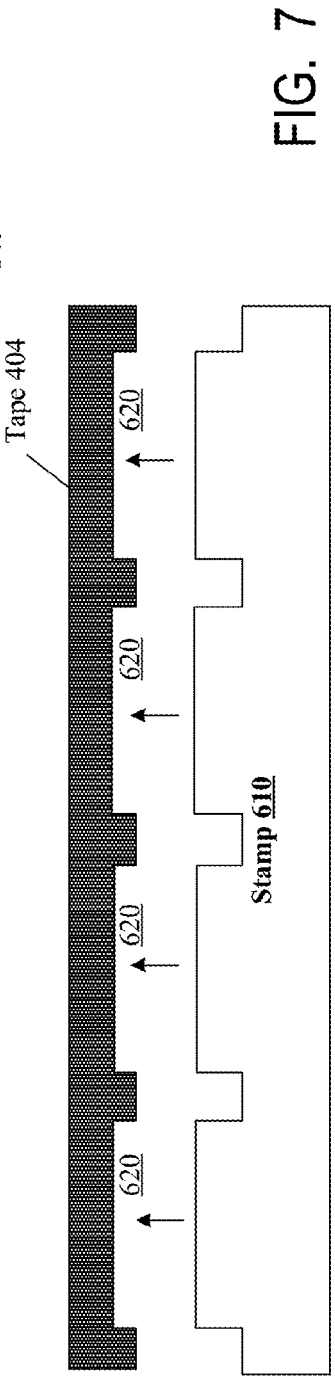

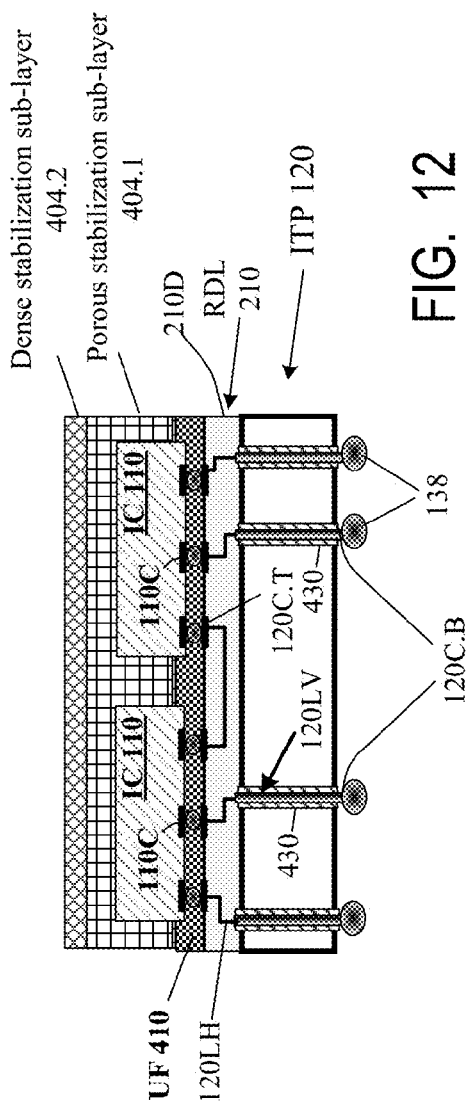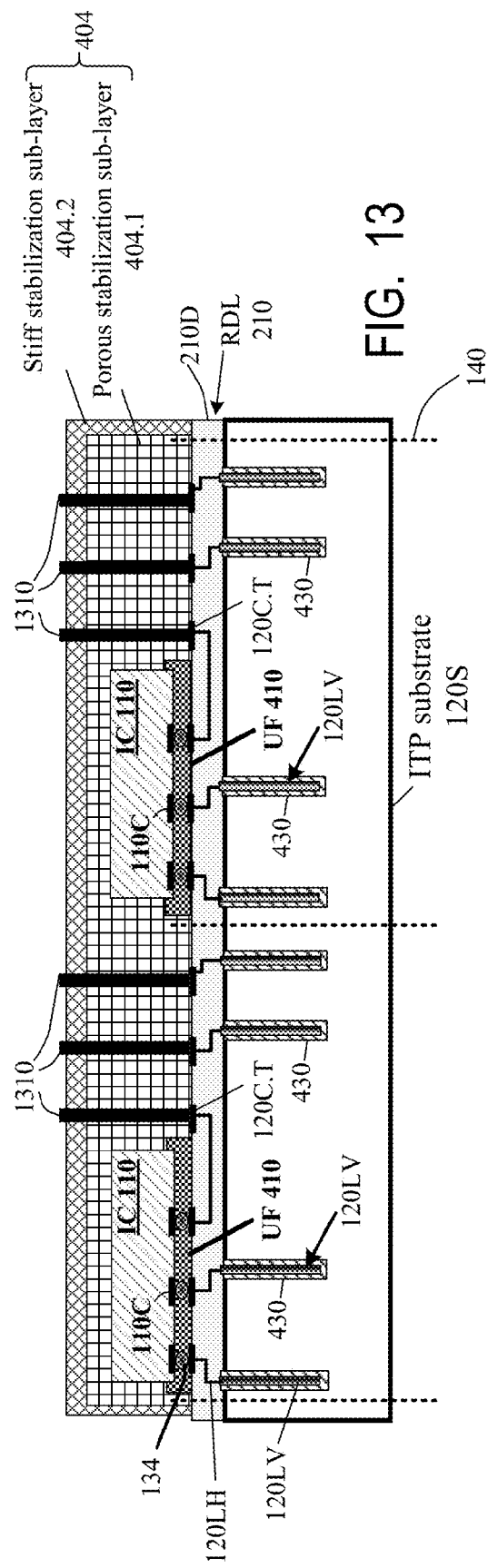

SEMICONDUCTOR PACKAGES AND OTHER CIRCUIT MODULES WITH POROUS AND NON-POROUS STABILIZING LAYERS

CROSS REFERENCE TO RELATED APPLICATIONS

The present application claims priority of U.S. provisional patent application No. 62/050,728, filed 15 Sep. 2014, incorporated herein by reference.

BACKGROUND OF THE INVENTION

The present invention relates to circuitry such as used in microelectronics.

The microelectronics industry has experienced an ever increasing demand for smaller and faster electronic devices able to support a greater number of increasingly complex and sophisticated functions. Accordingly, there is a continuing trend in the semiconductor industry to manufacture thin, low-cost, high-performance, low-power and high IO density integrated circuits (ICs), and interconnect similar or dissimilar ICs into a thin, reliable, low-cost, high-performance, and low-power package. These are conflicting goals since thinner ICs are harder to interconnect in a reliable, low-cost manner.

To address the packaging cost and reliability objectives, ICs and other circuits are often interconnected through intermediate substrates such as wiring substrates (e.g. printed circuit boards or other types) and interposers. FIG. 1 shows an exemplary package of multiple ICs 110 connected to each other and/or other circuits (not shown) through interposers ("ITP") 120.1 and 120.2 and wiring substrate 130. ICs 110 are attached to the interposers in a flip-chip manner, i.e. the ICs' bottom contact pads 110C are attached to top contact pads 120C.T of respective interposers 120.1, 120.2 by connections 134. Connections 134 can be formed by solder or solder composite, adhesive, diffusion bonding, or some other means. Interposers 120 (i.e. 120.1 and 120.2) have bottom contact pads 120C.B attached to the wiring substrate's top contact pads 130C by connections 138 (e.g. solder). Each interposer 120 (i.e. 120.1 and 120.2) includes conductive lines 120L interconnecting its contact pads 120C.T and 120C.B in a desired pattern in order to connect the respective ICs 110 to each other and to wiring substrate 130. Wiring substrate 130 has conductive lines 130L interconnecting the wiring substrate's contact pads 130C and hence interconnecting the ICs 110 located on the same or different interposers 120.

For cost reduction purposes, wiring substrates 130 are made of inexpensive, possibly non-semiconductor material (e.g. organic or ceramic) processed by inexpensive techniques (e.g. printing) to form the conductive lines 130L. In contrast, ICs 110 are manufactured by high precision but more expensive semiconductor technology allowing the ICs to be small and have high performance. As a result, the ICs' contact pads 110C can be spaced closer to each other (at a lower pitch) than the wiring substrate's contact pads 130C. Consequently, the ICs cannot be flip-chip attached to the wiring substrate. Interposers 120 "redistribute" the contact pads: the interposers 120 can be manufactured by high precision technology, with the top contact pads 120C.T matching the ICs' contact pads 110C but with the bottom contact pads 120C.B matching the wiring substrate.

Further, interposers 120 absorb and dissipate some of the heat generated by the ICs and thus reduce thermo-mechanical stresses (mechanical stresses resulting from thermal expansion). Also, if the interposers' coefficients of thermal expansion (CTE) are intermediate between the wiring substrate and the ICs, or are close to the ICs, then the IC-to-interposer connections 134 experience less thermo-mechanical stress. The connections 138 between the interposers and the wiring substrate may experience higher stresses due to the CTE mismatch between the interposers and the wiring substrate, but connections 138 can be made larger due to their high pitch, and therefore can be sturdy and reliable.

Each IC or interposer is typically manufactured in a large wafer format with other ICs or interposers, and the wafer is diced (singulated) into individual ICs or interposers (which are called die or chips). The ICs 110, interposers 120, and wiring substrate 130 can be attached to each other after dicing; see e.g. U.S. Pat. No. 8,138,015 B2 issued Mar. 20, 2012 to Joseph et al. However, reliable attachment of tiny, fragile ICs 110 to interposers is difficult. Therefore, wafer-level packaging is used, with some of the ICs or interposers being attached to each other before singulation and possibly even before the end of wafer processing; for instance, ICs 110 can be attached to interposers 120 before singulation of at least some of wafers. Moreover, some of the wafers can be initially thick for increased reliability, and can be thinned late in the manufacturing process; in such cases, some of the IC and interposer attachments can be performed before wafer thinning.

One example is shown in FIG. 2A: the interposer wafer 120W has not yet been singulated, but will be singulated along the lines 140 to form multiple interposers of the type of interposer 120.1 of FIG. 1. The IC wafers have been singulated, and ICs 110 have been attached to interposer wafer 120W. Moreover, in FIG. 2A, the interposers' bottom contact pads 120C.B have not yet been formed, and the interposer wafer 120W is thicker (and hence stronger) than its final size; the ICs have been attached before thinning of wafer 120W. Interposers 120.2 are fabricated in another wafer (not shown), possibly using the same or different wafer-level packaging techniques.

The interposer wafer of FIG. 2A is based on a substrate 120S (e.g. silicon or glass or other material with a CTE similar to the ICs). The interposer's conductive lines 120L include vertical vias 120LV going down into substrate 120S, and include other lines 120LH at the top of the wafer. Lines 120LH are electrically insulated from each other and from substrate 120S by dielectric 210D; lines 120LH and dielectric 210D form a "redistribution layer" (RDL) 210 used to redistribute the contact pads as described above.

Interposer wafer 120W is thinned from the bottom to expose the bottom ends of vias 120LV; the bottom ends will be used as contact pads 120C.B. However, in the wafer thinning operation, wafer 120W and substrate 120S become thin and fragile, easy to damage during or after thinning. Also, thinned wafer 120W can be warped, which complicates further processing including interposer attachment to wiring substrate 130. Therefore, before thinning, wafer 120W with ICs 110 attached at the top, can be strengthened by mold compound 310 (FIG. 2B) and carrier 320. Mold compound 310 is typically an organic polymeric material with fillers (e.g. silica). Carrier 320 can be a glass or silicon wafer, attached by adhesive 330.

As shown in FIG. 3, interposer substrate 120S is then thinned from the bottom, e.g. by mechanical and/or chemical processes, to expose the vias 120LV. The bottom ends of vias 120LV become contact pads 120C.B. Additional metal (e.g. solder) can be deposited on these bottom ends if needed. Then carrier 320 is debonded or ground away, the interposer wafer is singulated along lines 140 together with mold 310, and individual interposers 120.1, with ICs 110C on top, are attached to the same or different wiring substrates 130 as in FIG. 1.

Regrettably, mold compounds contribute to warpage because their CTEs are typically higher than for interposer wafers. The warpage progressively increases as the interposer wafer is thinned with mold compound on top. This complicates the process required to uniformly expose the vias 120LV during thinning. The increased warpage also complicates attaching the singulated substrate 120S to the wiring substrates 130.

U.S. pre-grant patent publication no. 2013/0082399 (Apr. 4, 2013; Kim et al.) describes a "semiconductor package including an internal package" with "at least one semiconductor chip sealed with an internal seal" (Abstract). The internal package is mounted on "an internal substrate", and sealed by "an external seal" (Id.). The Young's modulus of the internal seal is smaller than of the external seal to reduce warpage (Id.). Both seals can be made of filled resin, but the external seal has more filler to increase its Young's modulus (paragraphs 0056-0057, 0064-0065).

Alternative packaging techniques are desirable.

SUMMARY

This section summarizes some features of the invention. Other features may be described in the subsequent sections. The invention is defined by the appended claims, which are incorporated into this section by reference.

The inventors investigated the contributory factors affecting the warpage and confirmed a significant warpage degradation caused by a mold compound. Some manufacturing processes require the interposer wafer warpage to be limited to at most 500 µm for a 200 mm wafer diameter. The inventors experimented with two silicon 200 mm wafers of 720 µm thickness joined together by a 100 µm layer of underfill (the underfill was organic polymeric compound with fillers, similar to mold compound 310). When the wafers were first joined together, the warpage was null. Then the top wafer was diced by a 2 mm saw. The warpage increased to almost 1000 µm, far above the 500 µm limit. Then a mold compound was deposited; the mold compound filled the gaps between the die and had a planar top surface, being 350 µm thick over the die. The warpage increased to about 1200 µm. Next the top surface was lapped to remove the mold compound over the die and reduce the die thickness by 20 µm; the warpage was reduced, but remained slightly under 1000 µm. Then the bottom wafer was ground to 100 µm thickness. The warpage decreased but stayed above 500 µm. These tests suggest that the mold compound is a great impediment in reducing the wafer warpage to below 500 µm. Mold compounds with lower CTEs are available, but it is desired to find other warpage techniques, possible techniques effective for wide CTE ranges and not dependent on the CTE matching between the mold compound and the interposer wafer.

Some embodiments of the present invention reduce the wafer warpage by forming one or more gap regions, e.g. air gaps, between the mold compound and the interposer wafer. Also, in some embodiments, the mold compound is replaced by other materials that may or may not be deposited by techniques other than molding. The mold compound or other materials form a layer that stabilizes (strengthens) the wafer due to adhesion to ICs 110, possibly without contacting the wafer or contacting the wafer only in limited areas (due to the gap regions). The gap regions reduce the thermo-mechanical forces exerted by the stabilization layer on the interposer wafer, and thus reduce the warpage.

As noted above, the stabilization layer can be formed by non-molding techniques, e.g. lamination. Suitable laminates include materials conventionally used as dry film resists. They adhere well to the top of ICs 110, and are easy to remove (e.g. by laser ablation or grinding), so no adhesive is needed between the stabilization layer and the ICs 110. Further, in some embodiments, the stabilization layer can be left in the final structure.

According to another aspect, in some embodiments, there may or may not be a gap region between the stabilization layer and the wafer, but the stabilization layer includes a bottom sub-layer of porous material (e.g. aerogel or some other type of foam) with low elastic modulus in the horizontal direction (i.e. the direction parallel to interposer wafer 120W). The low horizontal modulus limits the stress exerted by the stabilization layer on the interposer wafer. At the same time, the stabilization layer has a high flexural modulus and hence high flexural strength, to resist warpage and strengthen the structure for further processing. These properties—high flexural modulus and low horizontal elastic modulus—are obtained in some foams. Alternatively or in addition, the stabilization layer may include one or more higher sub-layers with higher flexural moduli, e.g. non-porous sub-layers or sub-layers made of a foam having a lower porosity than the bottom sub-layer, to further strengthen the structure. The stabilization layer or at least its bottom sub-layer may or may not at least partially remain in the final structure.

In some embodiments, the stabilization layer is sufficiently strong to allow omission of carrier 320. This is advantageous since carrier bonding and debonding create reliability problems because on the one hand the adhesive 330 must be strong enough to withstand substrate thinning and subsequent processing of the bottom ends of vias 120LV, and on the other hand the adhesive 330 must be easily deactivated in the debonding process. Further, the bonding and debonding operations may have to be performed at low temperatures to avoid damage to the ICs and the interposer, and this further limits the choice of adhesives 330. If the carrier is attached by a permanent bond and then ground away, the grinding process also creates reliability problems. Carrier elimination is therefore desirable.

The stabilization layer itself may or may not change the warpage, possibly reducing or increasing the warpage in at least one area.

The packaging techniques described above are not limited to interposers or to the IC/interposer structures of the type shown in FIG. 1, and further the invention is not limited to the packaging techniques described above or any other features described above or below except as defined by the appended claims.

BRIEF DESCRIPTION OF THE DRAWINGS

FIG. 4A illustrates a vertical cross section of a semiconductor package structure according to some embodiments of the present invention.

FIG. 5 is a flowchart of a packaging process according to some embodiments of the present invention.

FIGS. 6, 7, 8, 9, 10, 11, 12, 13, 14 illustrate vertical cross sections of semiconductor package structures according to some embodiments of the present invention.

DESCRIPTION OF SOME EMBODIMENTS

The embodiments described in this section illustrate but do not limit the invention. The invention is not limited to particular dimensions or other parameters, or materials or processes or other features, except as defined by the appended claims.

Some aspects of the present invention will now be illustrated as a modification of the process of FIGS. 1, 2A, 2B, 3. FIG. 4A shows a stabilization layer 404 which can be formed, for example, in the structure of FIG. 2A or 2B or 3, possibly before, in the middle, or after thinning of the interposer wafer. In the example of FIG. 4A, the stabilization layer is formed before the wafer thinning, and will protect the ICs from wafer thinning byproducts during the thinning operation. FIG. 4A also shows some optional, conventional features such as underfill 410, possibly filled organic polymeric material. Underfills are well-known adhesives that bind ICs to interposers or wiring substrates (e.g. organic substrates) to strengthen the connections 134. The underfill is optional.

Another optional, conventional feature is dielectric 430 electrically insulating the vias 120LV from interposer substrate 120S. Dielectric 430 is usually absent if interposer substrate 120S is itself dielectric (e.g. glass).

Stabilizing layer 404 covers the structure and adheres to ICs 110 without additional adhesive. Layer 404 is separated from the interposer wafer 120W by a gap region (air gap) 450 at the interposer areas not covered by the ICs.

Figure 4B:
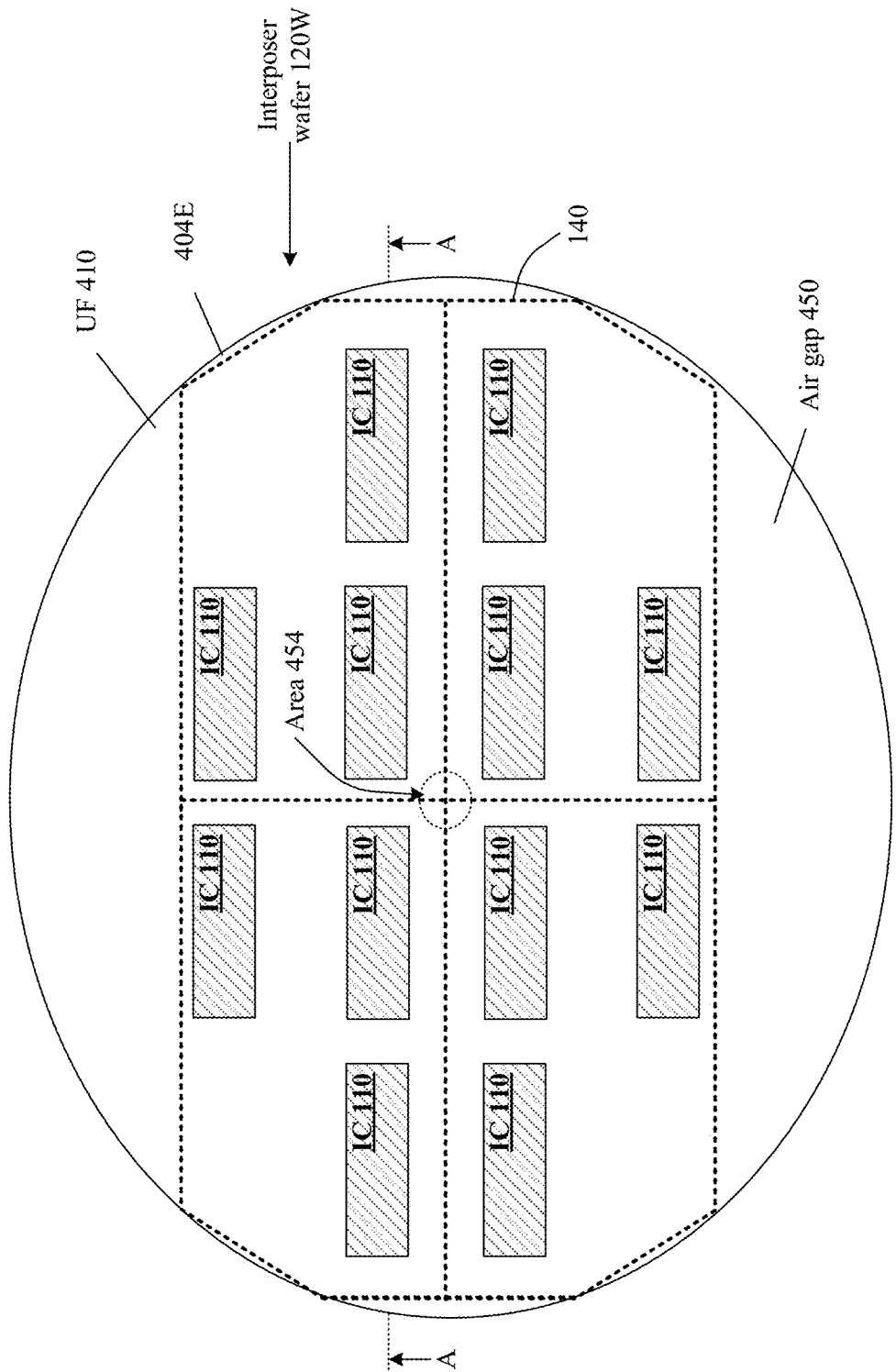
FIG. 4B illustrates a top view of a semiconductor package structure according to some embodiments of the present invention.

FIG. 4B shows the top view of the structure with stabilization layer 404 removed. The markings A-A denote the vertical cross sectional plane of FIG. 4A. In this example, air gap 450 extends throughout the area not occupied by ICs 110. In other embodiments, the air gap may be more restricted. For example, in some embodiments, stabilization layer 404 contacts the interposer wafer 120W at the wafer edges, possibly along the entire wafer edge 404E, so the air gap does not extend to the edges. In another embodiment, the air gap is absent in a limited area 454 in the middle of wafer 120W, between the ICs 110 or over one or more of the ICs, where the stabilization layer 404 adheres to the interposer wafer 120W (or underfill 410 if present) and thus strengthens the wafer without a significant warpage effect. The stabilization layer itself may or may not change the warpage, possibly reducing or increasing the warpage in at least one area (possibly the whole area of the structure). Other geometries of air gap 450 are possible.

Stabilization layer 404 can be a continuous layer covering the entire interposer wafer 120W, or may have through-holes at any desired places, e.g. over one or more ICs 410 or between the ICs. Further, stabilization layer 404 may consist of a number of disconnected pieces. Such features (holes and/or disconnected pieces) may be provided to reduce the wafer warpage or for other purposes.

Stabilization layer 404 is a material which can be formed in the structure at suitable temperatures (e.g. below 400° C. for some structures) so as to have strong adhesion to all or some of the top surfaces of ICs 110. Also, one or more of the ICs can be replaced by microelectronic packages (MPs), e.g. multichip modules (MCMs), and then the stabilization layer has strong adhesion to all or some of the IC or MP top surfaces. The ICs' or MPs' top surfaces can be organic and/or inorganic materials, and can have any electrical properties including conductor (e.g. a metal heat sink), semiconductor (e.g. silicon), or dielectric (e.g. silicon dioxide, silicon nitride, silicon oxynitride, polyimide, or other types commonly used as IC passivation layers, or ceramic or other materials).

Optionally (FIG. 4A), stabilization layer 404 may have downward protrusions 404P over all or part of the wafer area not covered by the ICs 110. Downward protrusions 404P narrow the gap 450 but they strengthen the structure, possibly reducing warpage. In some embodiments, protrusions 404P have good adhesion to the IC or MP sidewalls, with possibly the same adhesion strength as between layer 404 and the respective IC or MP top surfaces.

In some embodiments, stabilization layer 404 is a material commonly used as dry film resist, or a similar non-photoimageable material (similar in the sense that it can be formed by substantially the same techniques and have substantially the same warpage reduction properties).

In an exemplary process sequence (FIG. 5), stabilization layer 404 is laminated onto the ICs (or MPs) at step 480. The resulting structure is shown in FIG. 6. Stabilization layer 404 does not have protrusions 404P at this stage. Layer 404 covers the areas between the ICs but is separated by a gap region 450 from the interposer wafer (the gap region can be filled by air or some other gas; the gas may or may not be at vacuum). Stabilization layer 404 may or may not be a flat sheet at this stage. FIG. 6 shows a flat sheet, but due to the pressure applied to layer 404 in the lamination process the layer 404 may be recessed between the ICs 110 at least in wider areas between the ICs, and may physically contact the underfill 410 or wafer 120W along the wafer edge 404E.

At step 484, layer 404 is softened to flow down and form downward protrusions 404P (FIG. 4A). At step 490, layer 404 is cured if needed to increase its strength (e.g. increase its horizontal elastic modulus and flexural modulus).

In some embodiments, at step 484, layer 404 is softened by heat. This is appropriate for example if layer 404 is thermoplastic at this stage—layer 404 can be organic or inorganic thermoplastic material. In some of these embodiments, layer 404 becomes thermosetting at higher temperatures of the curing step 490.

If desired, layer 404 can be patterned to form through holes or disconnected pieces as mentioned above. The patterning can be done at any suitable stage before or after lamination, before or after step 484, and before or after step 490, by photolithography (if layer 404 is photoimageable at the patterning stage then no additional photoresist is used in some embodiments), laser ablation, or any other suitable means.

An exemplary starting material is a flat epoxy sheet known as SUEX TDFS (Thick Dry Film Sheet) available from DJ DevCorp of Massachusetts, United States. The main SUEX ingredient is Bisphenol A Novolac epoxy. In its viscous form known as Su-8, the epoxy is dissolved in an organic solvent (primarily gamma-butyrolactone (GBL) or cyclopentanone, depending on the formulation) and up to 10 wt % of mixed Triarylsulfonium/hexafluoroantimonate salt as the photoacid generator. In the dry form (SUEX), the solvent amount is less than 1 wt %. Some properties of the SUEX resist are described in Donald W. Johnson et al., "SUEX Dry Film Resist—A new Material for High Aspect Ratio Lithography", DJ DevCorp, Massachusetts, available at https://www.google.com/url?sa=t&rct=j&q=&esrc=s&source=web&cd=2&cad=rja&uact=8&ved=0CCgQFjABahUKEwjY28LQy7DHAhVXnYgKHbguAvY&url=http%3A%2F2Fwww.camd.lsu.edu%2Fmicrofabrication%2Fhighlights%2FDJ_AR2012_SUEX%2520overview.

pdf&ei=-hLSVdj2Bde6ogS43YiwDw&usg=
AFQjCNFZv0IGUL8J_qEXA3d6JMnDzTD_Jg&bv
m=bv.99804247,d.cGU, incorporated herein by reference.

Fully cured SUEX tape obtained at step 490 may have a horizontal elastic modulus of 3.9 GPa and tensile strength of 86 MPa (both measured by ASTM D3379-75, Dage tensile pull).

The initial thickness of SUEX sheet 404 (before step 480) can be 30 to 2000 μm, but this is not limiting. At step 480, the tape is laminated in vacuum at an ambient temperature of 25 to 150° C. and ambient pressure of 10 to 30 mTorr for 2 to 60 minutes. The SUEX material is thermoplastic at this stage, so it flows down into the air gap to form the downward protrusions 404P (FIG. 4A) around each IC 110. In some embodiments, the height hp of each protrusion 404P is 10 to 90% of the thickness of the IC 110. The protrusion height may vary over the wafer 120W depending on the lateral distance between the adjacent ICs 110 and on the materials of the sidewalls of the adjacent ICs (capillary effect).

The height ha of gap 450 depends on the height of ICs 110, and is at least 1 μm in some embodiments except at the wafer edge 404E.

SUEX layer 404 is cured at step 490. In the curing process, the SUEX material becomes thermosetting through cross-linking due to epoxy polymerization.

Other materials suitable for FIG. 5 processing include other epoxies, not necessarily photoimageable. These materials and other materials described herein may have additives (e.g. flame retardants) that do not materially affect their warpage reduction function.

Many variations are possible. For example, the top and/or bottom surfaces of stabilization layer 404 may be non-planar at any stage and may have any topology. At step 484, protrusions 404P may reach the interposer wafer 120W in some areas to close the gap 450. In some embodiments (e.g. for thermoplastic materials), the reach of protrusions 404P is controlled by localized heat, e.g. UV radiation: more heat is supplied at those locations where longer protrusions 404P are desired.

Protrusions 404P may also be formed before lamination of layer 404 over the ICs. A possible process is embossing (FIG. 7) using a suitable stamp 610, possibly glass, metal, organic polymer, or some other material. The stamp is pressed into a possibly flat layer 404 to form cavities 620 corresponding to the topology of ICs 110. The stamped layer 404 is then cured if needed, and placed over the ICs as in FIG. 4A. In some embodiments, layer 404 has good adhesion to the IC/MP materials mentioned above, so no additional adhesive is needed. In some embodiments, the adhesion is good both at the top surfaces and the sidewalls of the ICs or MPs. Then stabilization layer 404 can be further cured if needed, and can be patterned either before or after the lamination (e.g. during the embossing process).

In some embodiments, during the stamping operation (FIG. 7), layer 404 is softened. The softening can be done by heat if, for example, layer 404 is thermoplastic. For example, SUEX and some other materials can be softened by UV light transmitted from above the layer 404, or from below through the stamp 610 if the stamp is transparent to the UV radiation (the dose and other parameters are adjusted in accordance with the stamp's transmissivity). For SUEX, when cavities 620 have been formed, the layer 404 is cured before removing the stamp 610. After the SUEX layer 404 is placed on the ICs, layer 404 is further cured.

Embossing can also be performed on other materials.

Other processes can be used to form protrusions 404P before lamination of stabilization layer 404. Examples include chemical etches, laser ablation, printing of protrusions 404P (or possibly of the entire stabilization layer 404), and molding.

Figure 8:
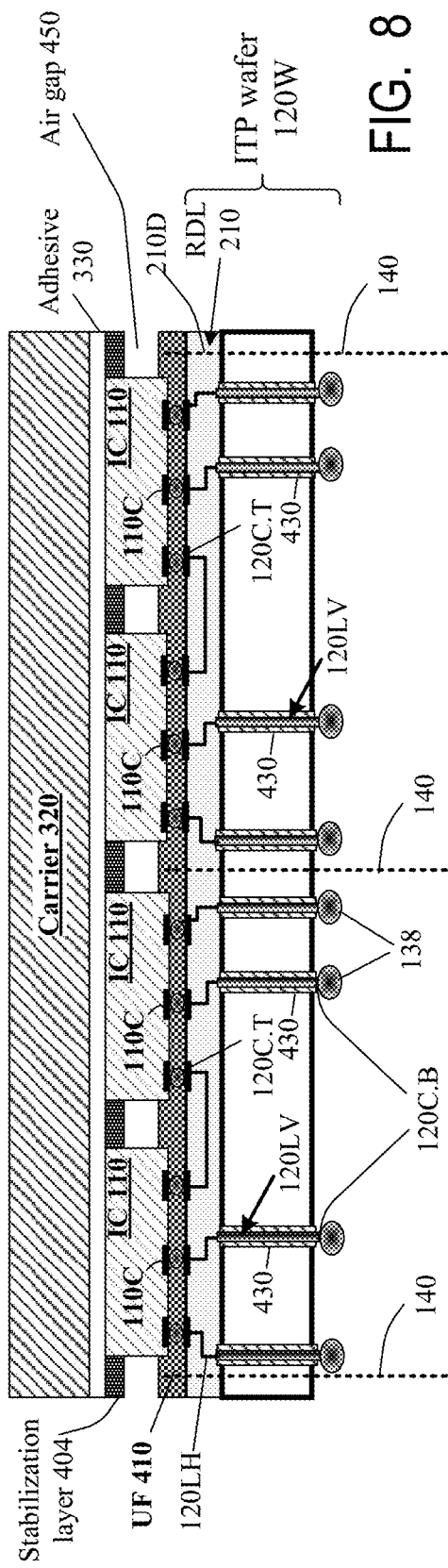

After the stage of FIG. 4A, the structure can be processed by any conventional or non-conventional steps. For example, stabilization layer 404 can be strengthened by a carrier 320 (FIG. 8) attached to the top surface of layer 404 by adhesive 330 as in FIG. 2B or 3. The carrier and the adhesive can be any materials consistent with the warpage reduction and other objectives, e.g. improved thermal conductivity for heat dissipation during manufacturing. Also optionally, stabilization layer 404 can be thinned before carrier attachment. The thinning process may or may not expose one or more (possibly all) ICs or MPs 110 from the top. The thinning process can be mechanical (lapping), chemical, or some other way. Part or all of the thinning process can be performed before full curing of layer 404 (i.e. before step 490) by chemical, mechanical, chemical-mechanical, and/or some other process(es).

Then the interposer wafer 120W is thinned from the bottom by thinning the interposer substrate 120S to expose the vias 120LV (if dielectric 430 is present then it is removed at the bottom). This thinning can be done by conventional processes, using mechanical, chemical, chemical/mechanical, and/or other techniques. The bottom ends of vias 120LV provide the interposer bottom contact pads 120C.B in the example of FIG. 8. In another variation, additional circuitry (e.g. RDL, similar to RDL 210) is formed on the bottom surface of interposer substrate 120S to provide the bottom contact pads 120C.B and connect these pads to the bottom ends of vias 120LV.

Additional layers 138 (e.g. solder or solder composite) can be provided on bottom contact pads 120C.B as needed.

Figure 9:
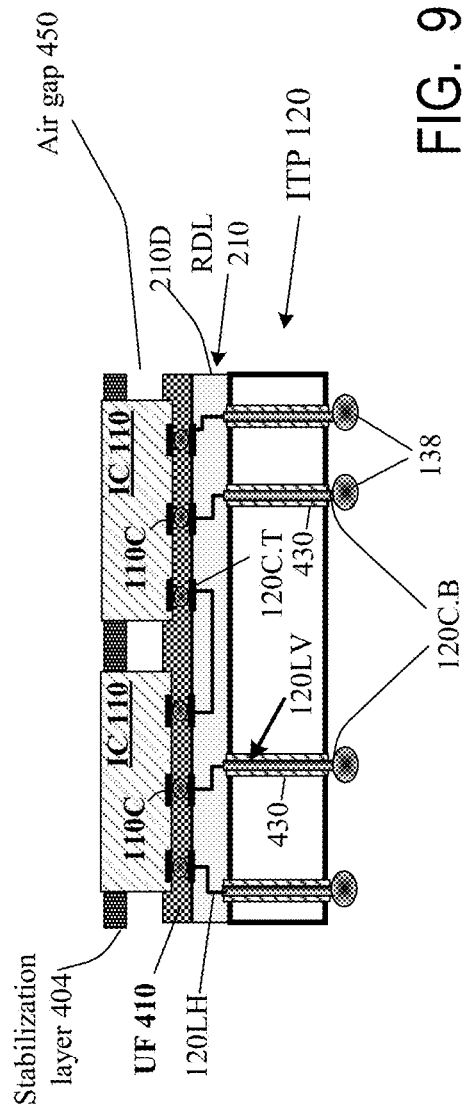

At any suitable stage—before or after deposition of layers 138—the interposer wafer 120W is singulated along the lines 140. Stabilization layer 404 is singulated at the same time. Carrier 320, if present, can be debonded before singulation. FIG. 9 shows a single die obtained in the singulation process (this die contains two die 110 and one interposer die 120).

If desired, a heat sink (not shown) can be attached at the top of the structure (e.g. to the exposed IC surfaces). In some embodiments, the heat sink has one or more cavities; the ICs 110 are in the cavities; the heat sink is attached to the interposer 120 around the ICs; the cavities contain thermal interface material (TIM, e.g. gel (possibly filled) or some other type) that contacts the ICs and the heat sink and provides a thermal path therebetween. TIM's thermal conductivity is higher than air.

Figure 10:
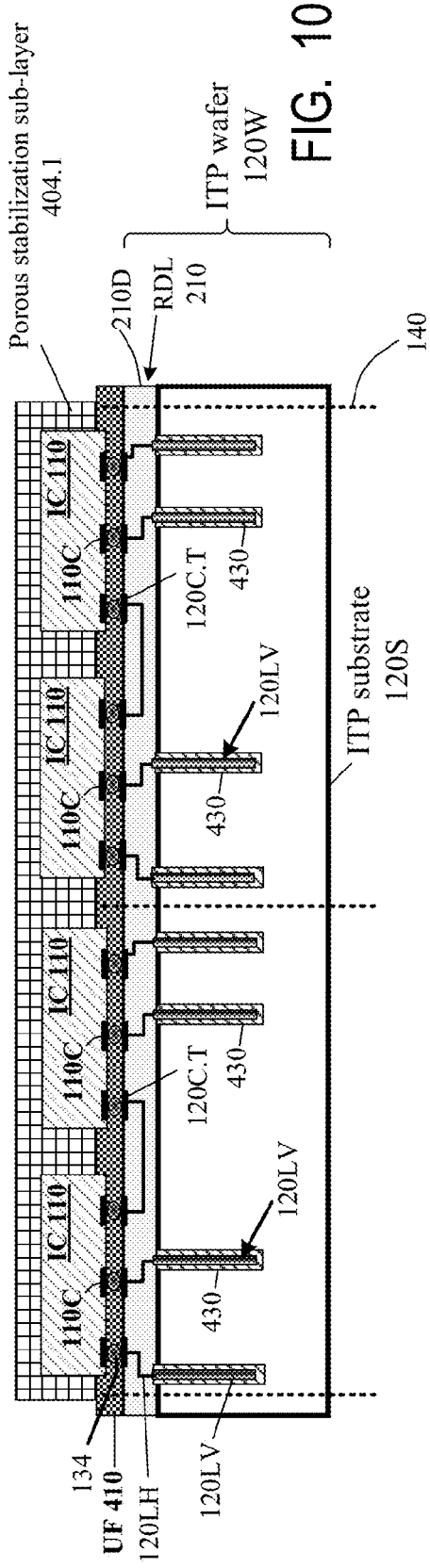
Figure 11:
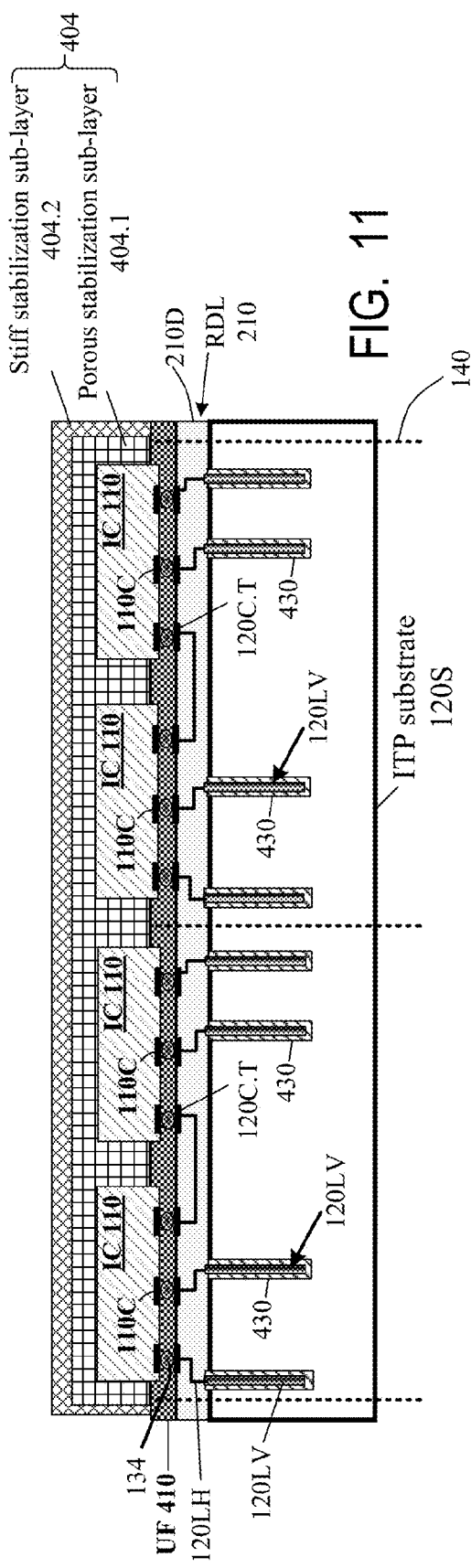

FIGS. 10-12 illustrate another approach for warpage reduction, using a porous stabilization sub-layer 404.1. In the example shown, the underlying structure is as in FIG. 4A, with ICs 110, interposer wafer 120W, and underfill 410. Other structures can also be used. Porous sub-layer 404.1 is formed over the structure, using any suitable techniques. Due to its porosity, layer 404.1 has a low horizontal elastic modulus, possibly 4 GPa or below, in order to reduce the thermo-mechanical stress on wafer 120W.

In some embodiments, layer 404.1 has a high flexural modulus to strengthen the structure; the flexural modulus can be higher than the horizontal modulus. For example, the horizontal modulus can be 500 MPa or less, possibly 100 MPa or less, while the flexural modulus under the three-point test can be higher. The appropriate moduli depend on the CTE mismatches and the final strength of the structure; for example, if the thinned interposer wafer is strong despite thinning, and/or the ICs 110 are densely positioned to strengthened the structure, than a lower flexural modulus and a higher horizontal modulus may be suitable.

In some embodiments, the porosity of layer 404.1 can be from 1% to 92% or higher. The average pore size can be 2 to 50 μm, and other sizes below or above this range are possible. The pores can be partially or completely filled with a thermal interface material (TIM); as used herein, TIM is any material having a thermal conductivity above the material of layer 404.1. Example TIMs are gels (possibly filled) and powders. Layer 404.2 may have the same structure and properties except for its higher horizontal and/or flexural modulus (TIM can be used as any material having a higher thermal conductivity than the material of layer 404.2). Layer 404.2 can be absent.

TIM is optional, and if used then it can be limited to parts of layer 404.1. Thus, layer 404.1 may have areas of different thermal conductivity. Lower thermal conductivity may be provided between those ICs 110 which should be thermally isolated from each other. For example, the pores can be filled with air in those areas.

Figure 1:
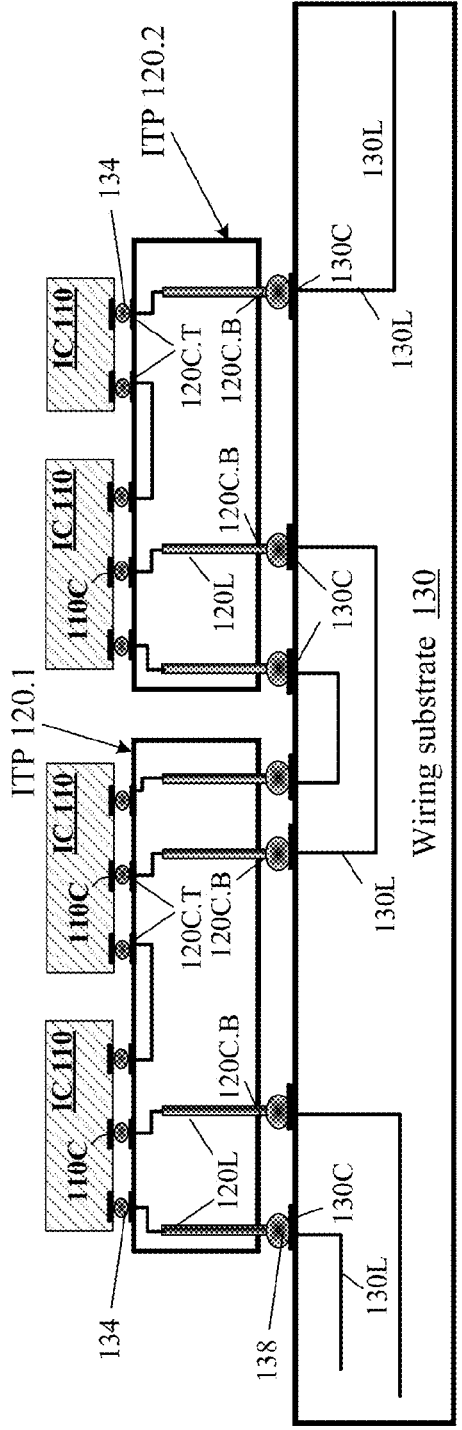
FIGS. 1, 2A, 2B, 3 illustrate vertical cross sections of semiconductor package structures according to prior art.
Figure 2A:
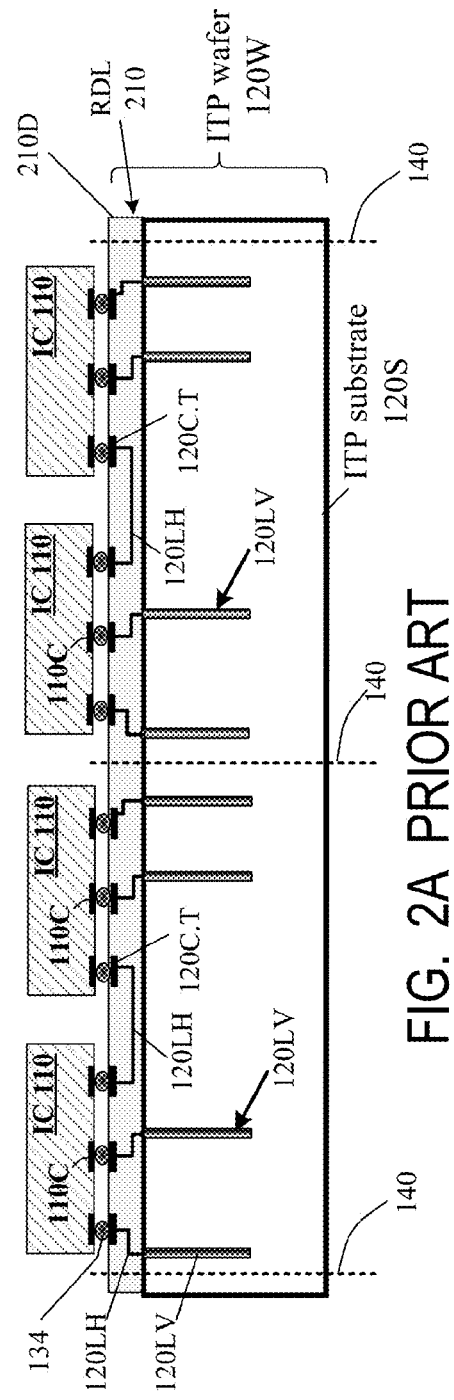
Figure 2B:
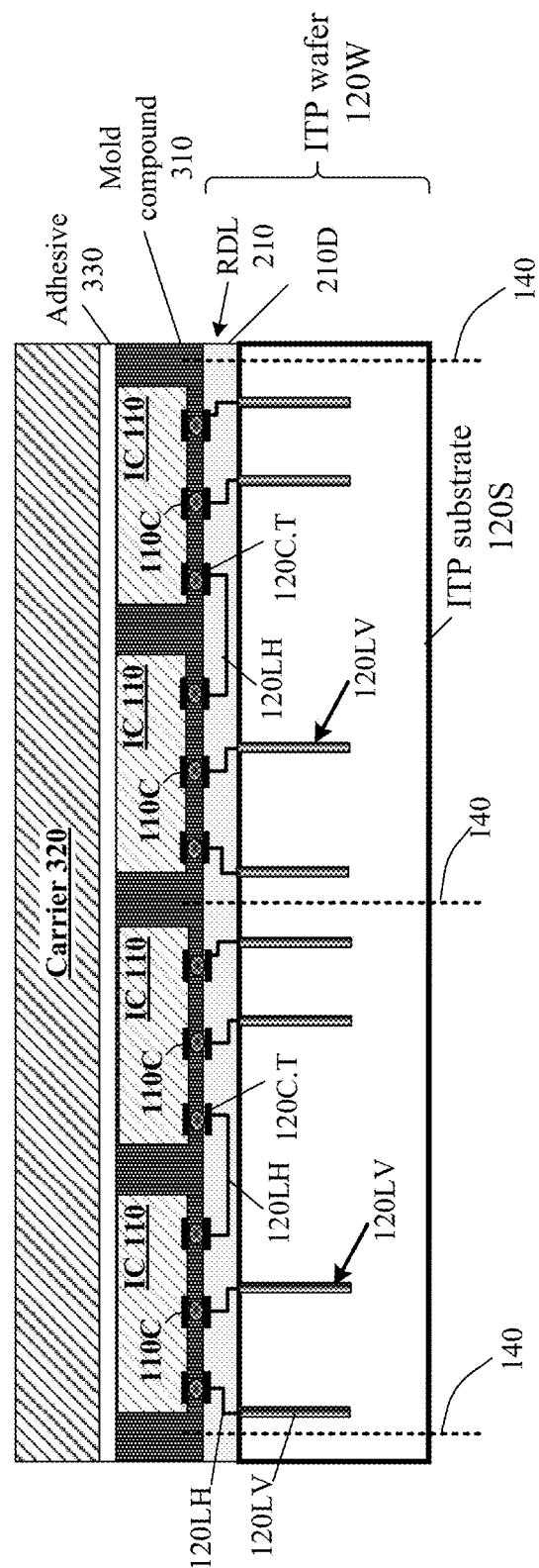
Figure 3:
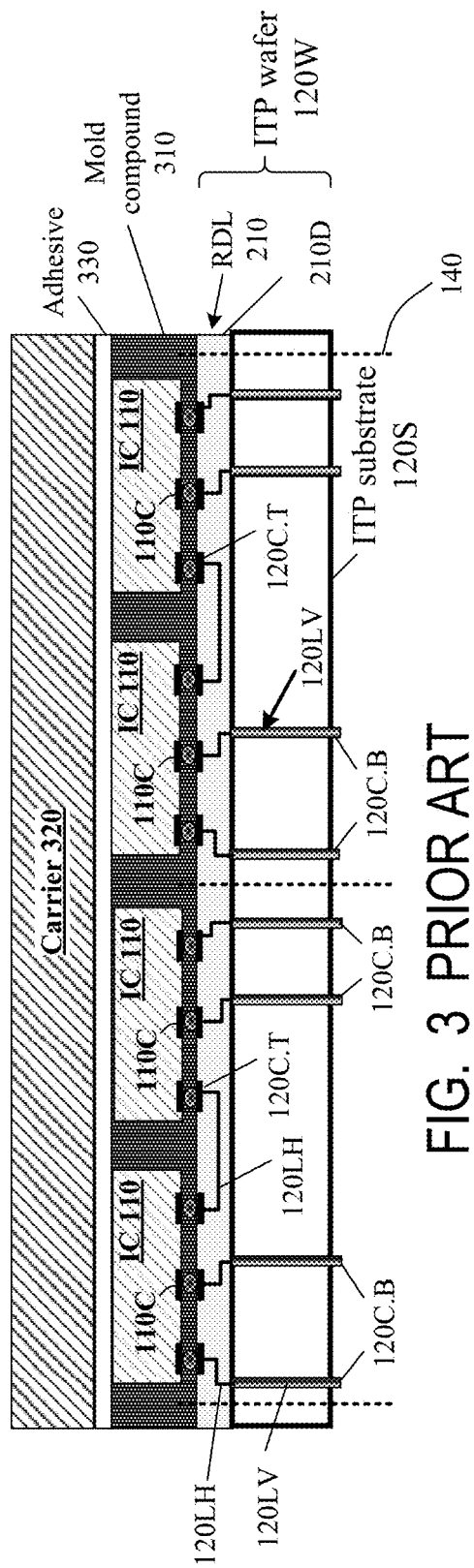

Then, as shown in FIG. 11, a stiffer layer 404.2 (i.e. with a higher horizontal and/or flexural modulus) is formed over layer 404.1. In some embodiments, the resulting layer 404 (i.e. combination of layers 404.1 and 404.2) is sufficiently strong to eliminate the need for carrier 320 (FIGS. 2B, 3). The manufacturing process is therefore simplified. However, a carrier can be used if desired. In some embodiments, stiffer layer 404.2 acts as sealing layer to prevent the debris of the interposer thinning process from getting into porous layer 404.1.

Layer 404.1 and/or 404.2 can be patterned with through holes or discontinuous pieces as described above for FIG. 4A. Subsequent processing (interposer wafer thinning and singulation) can be as described in connection with FIGS. 8-9. Any variations described above can be used with the porous layers as appropriate, including different types of interposer/IC structures and non-interposer structures.

Exemplary materials for layer 404.1 include foams (i.e. porous materials with gas filled pores), e.g. organic polymeric foams. Suitable foams include aerogels, e.g. polyimide aerogels. Suitable polyimide aerogels are described, for example, by NASA (National Aeronautics and Space Administration), United States of America, in a data sheet "NASA's Glenn Research Center's Mechanically Strong, Flexible Polyimide Aerogels", Oct. 16, 2012 (2 pages), incorporated herein by reference. See also the following U.S. pre-grant patent publications incorporated herein by reference: 2015/0141544 A1 (May 21, 2015; inventors: Meador et al.); 2015/0076987 A1 (Mar. 19, 2015; Sauti et al.); 2014/0272358 A1 (Sep. 18, 2014; Meador et al.). According to the NASA reference mentioned above, NASA's polyimide aerogels can withstand 300° C. temperatures, making them suitable for many wafer thinning processes. Their elastic modulus can be 1 to 100 MPa. Their porosity can be varied, and can exceed 90%, ensuring a correspondingly low horizontal elastic modulus. Moreover, even at high porosity, the polyimide aerogel film can have a high flexural modulus. An aerogel is obtained by supercritical drying of a gel. Layer 404.1 can be shaped by embossing (such as described above in connection with FIG. 7) or molding before, after or during e.g. in the middle) of the supercritical drying process, and can be laminated over the interposer wafer and the ICs to adhere both to typical IC or MP surface materials described above and to typical mold compounds used as underfills 410. In some embodiments, polyimide aerogel layer 404.1 has a planar top surface overlying the tallest IC 110 and the areas not covered by the ICs. The average pore size is 2 to 50 μm in some embodiments.

Such aerogels have a low thermal conductivity (e.g. 14 mW/m-K according to the NASA reference), and can be used to thermally isolate the adjacent ICs 110 from each other. TIM can be provided in those areas where high thermal conductivity is desired.

Other suitable materials include polyurethane foams. Still other materials can be suitable.

Some of the materials mentioned above, including polyimide aerogels and polyurethane foams, are open-pore materials, and layer 404.1 can be stiffened by an additional layer in the pores. In case of polyurethane foam and other cases, the additional layer can be electrolessly plated nickel, e.g. to a thickness of 5 μm or below (higher thickness can also be used; suitable thickness depends on many factors including the desired additional stiffness to be provided by the additional material).

As noted above, sub-layer 404.1 can be patterned with holes, possibly through-holes, which can be filled by the stiffer layer 404.2 to stiffen the structure. In the example of FIG. 11, layer 404.1 is absent at the edges of the structure where it is replaced by downward protruding portions of layer 404.2 (FIG. 11).

Layer 404.2 can be any suitable material having a higher horizontal and/or flexural modulus than layer 404.1. Suitable materials for layer 404.2 include mold compounds (as in FIG. 3), or the same types of materials as described above for layer 404.1. In some embodiments, layers 404.1 and 404.2 are the same material except that the layer 404.2 has lower porosity and hence higher horizontal and flexural moduli. For example, in some embodiments, the porosities of layers 404.1 and 404.2 are respectively 90% and 1%.

In an exemplary embodiment, layer 404.2 has a planar top surface and is 1 to 50 μm thick above the layer 404.1. This is not limiting.

FIG. 12 shows a single die after singulation of the interposer wafer 120W and of the underfill and stabilization layers 410, 440.1, 440.2. This die contains two die 110 and one interposer die 120.

In some embodiments, layer 404.1 has graded porosity—the porosity gradually decreases from the bottom to the top. Layer 404.2 may be absent.

As noted above, the ICs can be replaced by microelectronic packages. In fact, any components, including discrete components, can be present in addition to ICs. Exemplary components are wires 1310 (FIG. 13) attached to some of contact pads 120C.T before deposition of layers 404.1 and 404.2. Wires 1310 may or may not be vertical. They can be bonded to contact pads 120C.T by ultrasound bonding, like the BVA wires (Bond Via Array), or can be formed photo-lithographically or possibly by some other techniques; see *Invensas™ High Performance BVA PoP package for Mobile Systems*, May 2013 by Invensas Corporation of San Jose, Calif., incorporated herein by reference; see also U.S. Pat. No. 8,618,659 issued Dec. 31, 2013 to Sato et al., incorporated herein by reference; and U.S. pre-grant patent publication 2014/0036454 by Caskey et al., published Feb. 6, 2014, incorporated herein by reference. Other types of long direct connections can be solder stacks or solder lines. See for example E. Zakel et al., "High Speed Laser Solder Jetting Technology for Optoelectronics and MEMS Packaging", ICEP 2002, incorporated herein by reference. See also U.S. Pat. No. 6,455,785 issued Sep. 24, 2002 to Sakurai et al.; U.S. patent application Ser. Nos. 14/275,519 and 14/275,514, all incorporated herein by reference. Wires 1310 can be connected to other components (e.g. IC 110' in FIG. 14) to form a vertically integrated package.

Figure 14:
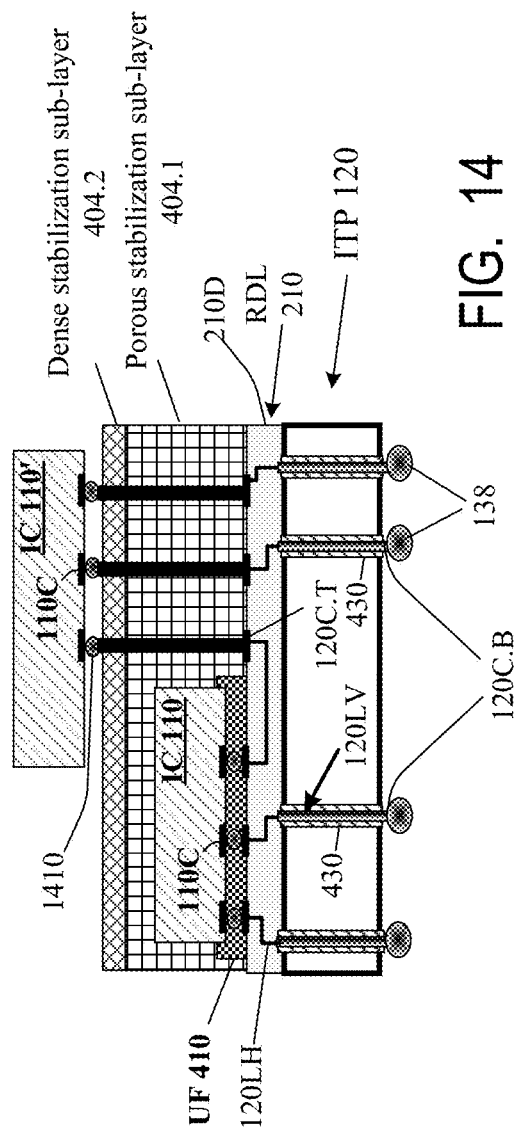

FIG. 14 shows the structure after dicing. Wires 1310 are attached to contact pads 110C of IC 110' by solder or solder composite 1410. IC 110' overlaps the lower IC 110. Other connections and packages are also possible.

The invention is not limited to the embodiments described above. For example, interposer wafer 120W can be replaced by a reconstituted wafer, a glass or polymeric panel (such as used in liquid crystal displays for example), a sacrificial substrate later removed (e.g. a sapphire substrate used for sensor fabrication), or some other type of structure.

Some aspects are defined by the following clauses.

Clause 1. A fabrication process comprising:

(1) obtaining an assembly (e.g. as in FIG. 2A or some other type) comprising:

one or more first modules each of which comprises circuitry comprising one or more contact pads (e.g. a first module can be an IC 110 or MCM or some other package or packaging component, e.g. a wiring substrate);

a first structure (e.g. interposer wafer 120W, possibly with underfill 410) comprising circuitry comprising one or more contact pads at a top side of the first structure;

wherein the one or more contact pads of the one or more first modules are attached to the one or more contact pads of the first structure; and then (2) forming a first layer (e.g. 404) over the first structure, the first layer adhering to the one or more first modules and overlying one or more areas of a top surface of the first structure which are not covered by the one or more first modules, the first layer being separated from the one or more areas by one or more gap regions (e.g. 450) underlying the first layer. A gap region is any region filled with gas, at any pressure, possibly at vacuum.

2. The fabrication process of clause 1 wherein the first layer adheres to a sidewall of at least one first module but does not cover the entire sidewall of the at least one first module.

3. The fabrication process of clause 1 or 2 wherein at least one first module has a sidewall having a first part exposed in the one or more gap regions and having a second part overlying the first part, the second part adhering to the first layer.

4. The fabrication process of any preceding clause wherein the one or more gap regions form a continuous gap region surrounding each first module.

5. The fabrication process of any preceding clause wherein the one or more first modules are a plurality of first modules.

6. The fabrication process of clause 5 wherein each first module has a sidewall surface exposed in the one or more gap regions.

7. The fabrication process of any preceding clause wherein each first module comprises a semiconductor integrated circuit.

8. The fabrication process of any preceding clause further comprising removing a bottom portion of the first structure (e.g. thinning the interposer substrate or performing a masked etch of the interposer substrate) while the first layer adheres to one or more first modules.

9. The fabrication process of any preceding clause comprising, after forming the first layer, dicing the first structure and the first layer to form a plurality of pieces each of which comprises at least one first module, a diced portion of the first structure, and a diced portion of the first layer.

10. The fabrication process of clause 9 further comprising attaching at least one said piece to a wiring substrate.

11. A structure comprising:

one or more first modules each of which comprises circuitry comprising one or more contact pads;

a first structure comprising circuitry comprising one or more contact pads at a top side of the first structure;

wherein the one or more contact pads of the one or more first modules are attached to the one or more contact pads of the first structure; and a first layer over the first structure, the first layer adhering to the one or more first modules and overlying one or more areas of a top surface of the first structure which are not covered by the one or more first modules, the first layer being separated from the one or more areas by one or more gap regions underlying the first layer.

12. The structure of clause 11 wherein the first layer adheres to a sidewall of at least one first module but does not cover the entire sidewall of the at least one first module.

13. The structure of clause 11 wherein at least one first module has a sidewall having a first part exposed in the one or more gap regions and having a second part overlying the first part, the second part adhering to the first layer.

14. The structure of clause 11, 12 or 13 wherein the one or more gap regions form a continuous gap region surrounding each first module.

15. The structure of clause 11, 12, 13, or 14 wherein the one or more first modules are a plurality of first modules.

16. The structure of clause 15 wherein each first module has a sidewall surface exposed in the one or more gap regions.

17. The structure of clause 11, 12, 13, 14, 15 or 16 wherein each first module comprises a semiconductor integrated circuit.

18. A fabrication process comprising:

(1) obtaining an assembly comprising:

one or more first modules each of which comprises circuitry comprising one or more contact pads;

a first structure comprising circuitry comprising one or more contact pads at a top side of the first structure;

wherein the one or more first modules are attached to the top side of the first structure, wherein the one or more contact pads of the one or more first modules being attached to the one or more contact pads of the first structure; and then (2) forming a first layer (e.g. 404.1) over the first structure, the first layer adhering to the one or more first modules, the first layer being porous and extending substantially along a first plane, the first layer having a lower elastic modulus along the first plane than a flexural modulus in a direction perpendicular to the first plane.

19. The fabrication process of clause 18 further comprising forming a second layer (e.g. 404.2) over the first layer, the second layer having a greater elastic modulus in at least one direction than the first layer.

20. The fabrication process of clause 19 wherein the second layer is porous.

21. The fabrication process of clause 19 or 20 wherein the second layer is the same material as the first layer except that the second layer has lower porosity than the first layer.

22. The fabrication process of clause 18, 19, 20, or 21 wherein the first layer consists essentially of an aerogel.

23. The fabrication process of clause 18, 19, 20, 21 or 22 wherein the first layer consists essentially of a polyimide aerogel.

24. A structure comprising:

one or more first modules each of which comprises circuitry comprising one or more contact pads;

a first structure comprising circuitry comprising one or more contact pads at a top side of the first structure;

wherein the one or more first modules are attached to the top side of the first structure, the one or more contact pads of the one or more first modules being attached to the one or more contact pads of the first structure; and a first layer over the first structure, the first layer adhering to the one or more first modules, the first layer being porous and extending substantially along a first plane, the first layer having a higher elastic modulus along the first plane than a flexural modulus in a direction perpendicular to the first plane.

25. The structure of clause 24 further comprising forming a second layer over the first layer, the second layer having a greater elastic modulus in at least one direction than the first layer.

26. The structure of clause 25 wherein the second layer is porous.

27. The structure of clause 25 or 26 wherein the second layer is the same material as the first layer except that the second layer has lower porosity than the first layer.

28. The structure of clause 24, 25, 26 or 27 wherein the first layer consists essentially of an aerogel.

29. The structure of clause 24, 25, 26, 27 or 28 wherein the first layer consists essentially of a polyimide aerogel.

Other embodiments and variations are within the scope of the invention, as defined by the appended claims.

The invention claimed is:

1. A fabrication process comprising:
(1) obtaining an assembly comprising:
one or more first modules each of which comprises circuitry comprising one or more contact pads;
a first structure comprising circuitry comprising one or more contact pads at a top side of the first structure;
wherein the one or more contact pads of the one or more first modules are attached to the one or more contact pads of the first structure; and then
(2) forming a first layer over the first structure, the first layer adhering to the one or more first modules and comprising an organic polymeric layer strengthening the assembly, the organic polymeric layer overlying one or more areas of a top surface of the first structure which are not covered by the one or more first modules, the organic polymeric layer being separated from the one or more areas by one or more gap regions underlying the first layer;
wherein forming the first layer comprises:
laminating a film comprising organic material over the first structure, the film being separated from the one or more areas and covering a top of each first module;
curing the film to form the organic polymeric layer; and
before or after completion of said curing, thinning the film to expose the top of at least one first module.

2. The fabrication process of claim 1 wherein the one or more gap regions form a continuous gap region surrounding each first module.

3. The fabrication process of claim 1 wherein the one or more first modules are a plurality of first modules.

4. The fabrication process of claim 3 wherein each first module has a sidewall surface exposed in the one or more gap regions.

5. The fabrication process of claim 1 wherein each first module comprises a semiconductor integrated circuit.

6. A fabrication process comprising:
(1) obtaining an assembly comprising:
one or more first modules each of which comprises circuitry comprising one or more contact pads;
a first structure comprising circuitry comprising one or more contact pads at a top side of the first structure;
wherein the one or more contact pads of the one or more first modules are attached to the one or more contact pads of the first structure; then
(2) forming a first layer over the first structure, the first layer adhering to the one or more first modules and overlying one or more areas of a top surface of the first structure which are not covered by the one or more first modules, the first layer being separated from the one or more areas by one or more gap regions underlying the first layer;
wherein the first layer adheres to a sidewall of at least one first module but does not cover the entire sidewall of the at least one first module; and
wherein forming the first layer comprises:
forming the first layer to cover a top of at least one first module; and then
thinning the first layer to expose the top of said at least one first module.

7. A fabrication process comprising:
(1) obtaining an assembly comprising:
one or more first modules each of which comprises circuitry comprising one or more contact pads;
a first structure comprising circuitry comprising one or more contact pads at a top side of the first structure;
wherein the one or more contact pads of the one or more first modules are attached to the one or more contact pads of the first structure; and then
(2) forming a first layer over the first structure, the first layer adhering to the one or more first modules and overlying one or more areas of a top surface of the first structure which are not covered by the one or more first modules, the first layer being separated from the one or more areas by one or more gap regions underlying the first layer;
wherein at least one first module has a sidewall having a first part exposed in the one or more gap regions and having a second part overlying the first part, the second part adhering to the first layer; and
wherein forming the first layer comprises:
forming the first layer to cover a top of at least one first module; and then
thinning the first layer to expose the top of said at least one first module.

8. A fabrication process comprising:
(1) obtaining an assembly comprising:
one or more first modules each of which comprises circuitry comprising one or more contact pads;
a first structure comprising circuitry comprising one or more contact pads at a top side of the first structure;
wherein the one or more contact pads of the one or more first modules are attached to the one or more contact pads of the first structure; and then
(2) forming a first layer over the first structure, the first layer adhering to the one or more first modules and overlying one or more areas of a top surface of the first structure which are not covered by the one or more first modules, the first layer being separated from the one or more areas by one or more gap regions underlying the first layer;
removing a bottom portion of the first structure while the first layer adheres to one or more first modules.

9. A fabrication process comprising:
(1) obtaining an assembly comprising:
one or more first modules each of which comprises circuitry comprising one or more contact pads;
a first structure comprising circuitry comprising one or more contact pads at a top side of the first structure;

wherein the one or more contact pads of the one or more first modules are attached to the one or more contact pads of the first structure; and then (2) forming a first layer over the first structure, the first layer adhering to the one or more first modules and comprising an organic polymeric layer strengthening the assembly, the organic polymeric layer overlying one or more areas of a top surface of the first structure which are not covered by the one or more first modules, the organic polymeric layer being separated from the one or more areas by one or more gap regions underlying the first layer;

wherein forming the first layer comprises:

laminating a film comprising organic material over the first structure, the film being separated from the one or more areas; and after laminating the film, curing the film to form the organic polymeric layer;

(3) after forming the first layer, dicing the first structure and the first layer to form a plurality of pieces each of which comprises at least one first module, a diced portion of the first structure, and a diced portion of the first layer.

10. The fabrication process of claim 9 further comprising attaching at least one said piece to a wiring substrate.

11. A structure comprising:
one or more first modules each of which comprises circuitry comprising one or more contact pads;
a first structure comprising circuitry comprising one or more contact pads at a top side of the first structure;
wherein the one or more contact pads of the one or more first modules are attached to the one or more contact pads of the first structure; and
a first layer over the first structure, the first layer being an organic polymeric layer strengthening the structure, the first layer adhering to the one or more first modules and overlying one or more areas of a top surface of the first structure which are not covered by the one or more first modules, the first layer being separated from the one or more areas by one or more gap regions underlying the first layer;
wherein the first layer does not cover a top of at least one first module.

12. The structure of claim 11 wherein the one or more gap regions form a continuous gap region surrounding each first module.

13. The structure of claim 11 wherein the one or more first modules are a plurality of first modules.

14. The structure of claim 13 wherein each first module has a sidewall surface exposed in the one or more gap regions.

15. The structure of claim 11 wherein each first module comprises a semiconductor integrated circuit.

16. A structure comprising:
one or more first modules each of which comprises circuitry comprising one or more contact pads;
a first structure comprising circuitry comprising one or more contact pads at a top side of the first structure;
wherein the one or more contact pads of the one or more first modules are attached to the one or more contact pads of the first structure; and
a first layer over the first structure, the first layer adhering to the one or more first modules and overlying one or more areas of a top surface of the first structure which are not covered by the one or more first modules, the first layer being separated from the one or more areas by one or more gap regions underlying the first layer;
wherein the first layer adheres to a sidewall of at least one first module but does not cover the entire sidewall of the at least one first module;
wherein the first layer does not cover a top of at least one first module.

17. A structure comprising:
one or more first modules each of which comprises circuitry comprising one or more contact pads;
a first structure comprising circuitry comprising one or more contact pads at a top side of the first structure;
wherein the one or more contact pads of the one or more first modules are attached to the one or more contact pads of the first structure; and
a first layer over the first structure, the first layer adhering to the one or more first modules and overlying one or more areas of a top surface of the first structure which are not covered by the one or more first modules, the first layer being separated from the one or more areas by one or more gap regions underlying the first layer;
wherein at least one first module has a sidewall having a first part exposed in the one or more gap regions and having a second part overlying the first part, the second part adhering to the first layer;
wherein the first layer has a polished top surface and does not cover a top of at least one first module.

18. A fabrication process comprising:
(1) obtaining an assembly comprising:
one or more first modules each of which comprises circuitry comprising one or more contact pads;
a first structure comprising circuitry comprising one or more contact pads at a top side of the first structure;
wherein the one or more first modules are attached to the top side of the first structure, wherein the one or more contact pads of the one or more first modules being attached to the one or more contact pads of the first structure; and then
(2) forming a first layer over the first structure, the first layer adhering to the one or more first modules, the first layer being porous and extending substantially along a first plane, the first layer having a lower elastic modulus along the first plane than a flexural modulus in a direction perpendicular to the first plane;
wherein the first layer consists essentially of a polyimide aerogel.

19. A structure comprising:
one or more first modules each of which comprises circuitry comprising one or more contact pads;
a first structure comprising circuitry comprising one or more contact pads at a top side of the first structure;
wherein the one or more first modules are attached to the top side of the first structure, the one or more contact pads of the one or more first modules being attached to the one or more contact pads of the first structure; and
a first layer over the first structure, the first layer adhering to the one or more first modules, the first layer being porous and extending substantially along a first plane, the first layer having a lower elastic modulus along the first plane than a flexural modulus in a direction perpendicular to the first plane;
wherein the first layer consists essentially of a polyimide aerogel.

* * * * *